(12) United States Patent
Shin

(10) Patent No.: US 8,229,053 B2  
(45) Date of Patent: Jul. 24, 2012

(54) LOW-JITTER SPREAD-SPECTRUM CLOCK GENERATOR

(75) Inventor: Jong-Shin Shin, Anyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 918 days.

(21) Appl. No.: 11/833,362

(22) Filed: Aug. 3, 2007

(65) Prior Publication Data

US 2008/0074154 A1    Mar. 27, 2008

(30) Foreign Application Priority Data

Aug. 10, 2006    (KR) .................. 10-2006-0075715

(51) Int. Cl.  
*H03D 3/24* (2006.01)  
*H04B 1/69* (2011.01)

(52) U.S. Cl. ........................ 375/376; 375/130

(58) Field of Classification Search .................. 375/354, 375/371, 373, 376, 130, 54  
See application file for complete search history.

(56) References Cited

U.S. PATENT DOCUMENTS

| | | | |
|---|---|---|---|
| 6,125,157 A | | 9/2000 | Donnelly et al. |
| 6,133,773 A | * | 10/2000 | Garlepp et al. ............ 327/247 |
| 6,559,698 B1 | | 5/2003 | Miyabe |
| 2004/0252751 A1 | | 12/2004 | Ogasawara |
| 2007/0247239 A1 | * | 10/2007 | Maunuksela et al. .......... 331/45 |
| 2011/0221506 A1 | * | 9/2011 | Tamura et al. ............ 327/355 |

* cited by examiner

*Primary Examiner* — Kevin M Burd  
(74) *Attorney, Agent, or Firm* — F. Chau & Associates, LLC (57) ABSTRACT

A spread-spectrum clock generator includes: a phase interpolator mixing a plurality of clock signals, which differ from each other in phase, and modulating a clock signal resulting from mixing the clock signals; and a controller generating a control signal to generate weights of the plurality of clock signals for modulating the clock signal. The phase interpolator regulates a modulation speed of the clock by adjusting a generation speed of the weights.

11 Claims, 8 Drawing Sheets

(PRIOR ART)

LOW-JITTER SPREAD-SPECTRUM CLOCK GENERATOR

CROSS-REFERENCE TO RELATED APPLICATION

This U.S. non-provisional patent application claims priority under 35 U.S.C. δ 119 of Korean Patent Application No. 2006-75715 filed on Aug. 10, 2006, the entire contents of which are hereby incorporated by reference.

BACKGROUND

The present disclosure relates to a spread-spectrum clock generator.

Phase-locked loops (PLLs) are generally employed in most digital systems operating synchronously. With improvements in technology, digital systems are evolving in operation frequency and integration density, and PLLs are evolving as well. The high-speed development of the digital systems and PLLs is usually accompanied by the adverse effect of electromagnetic interference (EMI). EMI may be induced when an energy level is over a predetermined reference value, adversely affecting peripheral electronic devices and causing malfunctions therein. In particular, because semiconductor devices are highly sensitive to EMI, it should not be neglected in designing semiconductor integrated circuits.

For the purpose of reducing EMI, there is a technique that utilizes a spread-spectrum clock generator. More specifically, the spread-spectrum clock generator acts to reduce EMI, by modulating a reference signal, which has high energy at a specific frequency, into a signal that operates in a predetermined bandwidth and has lower energy than the reference signal at a frequency of the bandwidth. As an example, if the reference signal frequency is 3 GHz, the spread-spectrum clock generator conducts the modulation operation to cause the signal to vary between 3 GHz and 2.97 GHz for predetermined repeating cycles.

As such, a clock signal from a PLL is modulated to vary in a predetermined range of frequency, not to be fixed to a single frequency, thereby becoming a signal not affecting peripheral electronic devices by EMI, because the energy of the clock signal disperses at a specific frequency.

The spread-spectrum clock generator operates to reduce a power gain by step-wise modulating a clock frequency of the PLL. Therefore, the spread-spectrum clock generator is a so-called clock generator for lessening the adverse effect of EMI.

Figure 1:
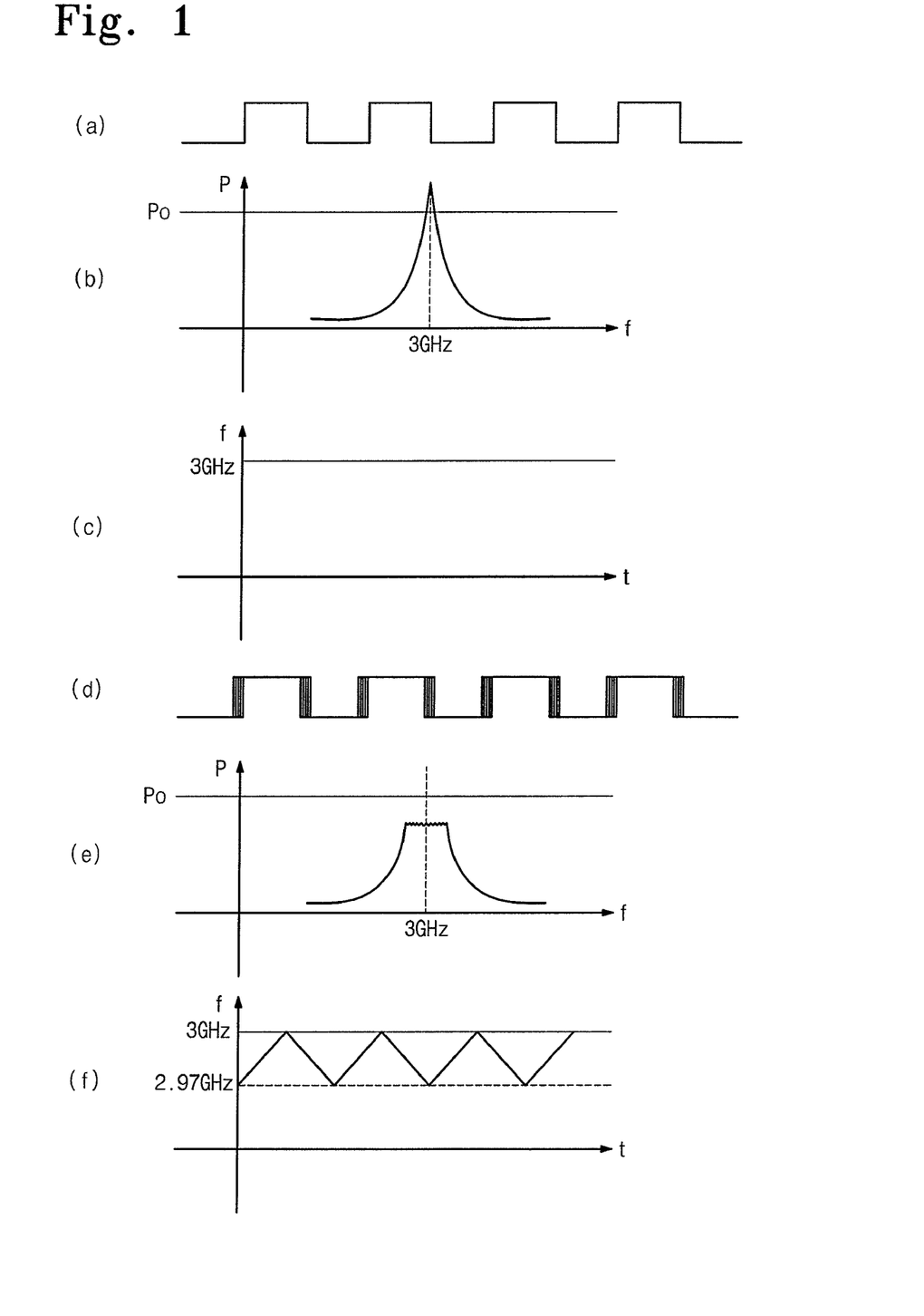
FIG. 1(a) shows a clock signal oscillating in a regular frequency without using a spread-spectrum clock generator.
FIG. 1(b) shows a frequency spectrum with a center frequency over a predetermined energy level P0, that would generate EMI at a reference frequency of 3 GHz.
FIG. 1(c) shows a frequency variation of a PLL output signal over time.
FIG. 1(d) shows a clock signal oscillating at a variable frequency, generated using a spread-spectrum clock generator.
FIG. 1(e) shows a frequency spectrum spreading with a peak under the predetermined energy level P0, dispersing around the reference frequency.
FIG. 1(f) shows a frequency variation of an output signal over time.

FIG. 1 at (a) through (f) shows reference frequency variations of a general PLL output signal and an output signal obtained by using the spread-spectrum clock generator. FIG. 1(a) shows a clock signal oscillating at a regular frequency without using the spread-spectrum clock generator. FIG. 1(b) shows a frequency spectrum having a center frequency peak over a predetermined energy level P0, generating the effect, of EMI at a reference frequency, 3 GHz. FIG. 1(c) shows a frequency variation of the PLL output signal over time, oscillating at the regular reference frequency. FIG. 1(d) shows a clock signal oscillating at a variable frequency, using the spread-spectrum clock generator. FIG. 1(e) shows a frequency spectrum spreading with a peak power less than the predetermined energy level P0, dispersing around the reference frequency. FIG. 1(f) shows a frequency variation of an output signal over time. As described above, the frequency is modulated to vary between 3 GHz and 2.97 GHz.

Generally, the process of measuring jitter is carried out on a spread spectrum clock signal that has experienced clock data recovery (CDR). If there is jitter over a bandwidth of CDR while generating the spread spectrum clock signal, however, the jitter remains therein, and is not filtered through the CDR.

Figure 2:
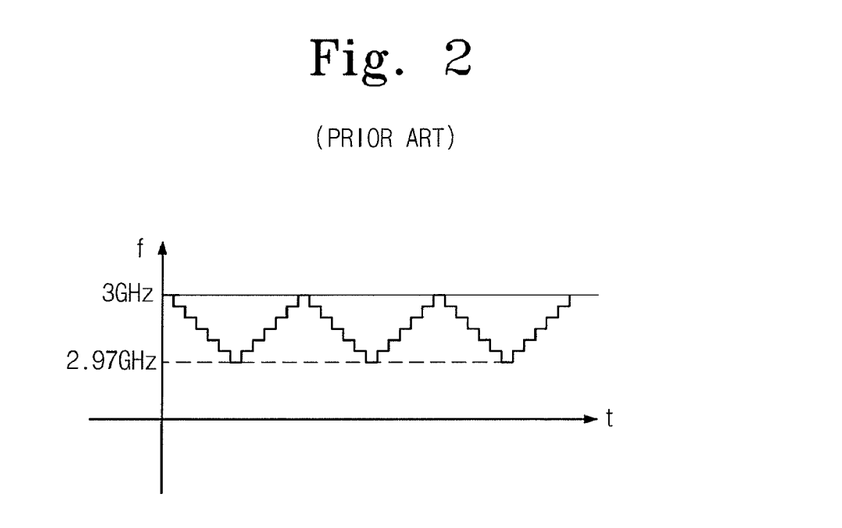
FIG. 2 shows a spread spectrum clock signal generated by a general spread-spectrum clock generator.

FIG. 2 shows a spread spectrum clock signal produced by a general spread-spectrum clock generator. Referring to FIG. 2, the general spread-spectrum clock generator produces an abrupt change of phase. For that reason, there is jitter having a high frequency while generating a spread-spectrum clock. That high-frequency jitter cannot be filtered by a CDR process at a reception stage. Therefore, there is a problem that the jitter still remains even after the CDR.

SUMMARY OF THE INVENTION

Exemplary embodiments of the present invention are directed to solve the aforementioned problem, providing a spread-spectrum clock generator capable of lessening high-frequency jitter.

An exemplary embodiment of the present invention provides a spread-spectrum clock generator including: a phase interpolator mixing a plurality of clock signals, which are different each other in phase, and modulating a clock signal resulting from the clock signal mixture; and a controller generating a control signal to generate weights of the plurality of clock signals for modulation of the clock signal. The phase interpolator regulates a modulation speed of the clock signal by adjusting a generation speed of the weights.

In this exemplary embodiment, the control signal varies periodically.

In this exemplary embodiment, the weights are currents.

According to an exemplary embodiment, the phase interpolator includes: a phase mixer synthesizing phases by means of the current, weights with the plurality of clock signals; a weight generator providing the current weights in response to adjusting signals; and a weight generation speed controller generating the adjusting signals in response to the control signal, the generation rate of the adjusting signals being regulated to control the generation speed of the current weights.

In an exemplary embodiment, the phase mixer uses a differential input unit.

In an exemplary embodiment, the weight generator includes an NMOS transistor receiving the adjusting signal through a gate and generating the current weight.

In an exemplary embodiment, the weight generation speed controller uses a delay unit to regulate the generation rate of the adjusting signals.

In an exemplary embodiment, the weight generation speed controller uses voltages, which are charged in capacitors, for the adjusting signals.

In an exemplary embodiment, the delay unit uses a RC filtering loop

In this exemplary embodiment, the delay unit uses a time of charging the capacitor as a delay time by means of the capacitor and a current source.

According to an exemplary embodiment of the present invention, a spread-spectrum clock signal generator includes: a phase interpolator mixing a plurality of clock signals, which are different each other in phase, and modulating a clock signals resulting from the clock signal mixture, in response to a control signal; and a controller generating the control signal. The control signal increases in an analog manner, and the clock signal is generated also in an analog manner.

In an exemplary embodiment, the control signal is generated from an RC filtering loop for the increase in the analog manner.

In an exemplary embodiment, the controller is a sigma delta modulator.

In an exemplary embodiment, the plurality of clock signals is transferred to a phase-locked loop.

A further understanding of the nature and advantages of exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the accompanying drawings. In the figures.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

Figure 3:
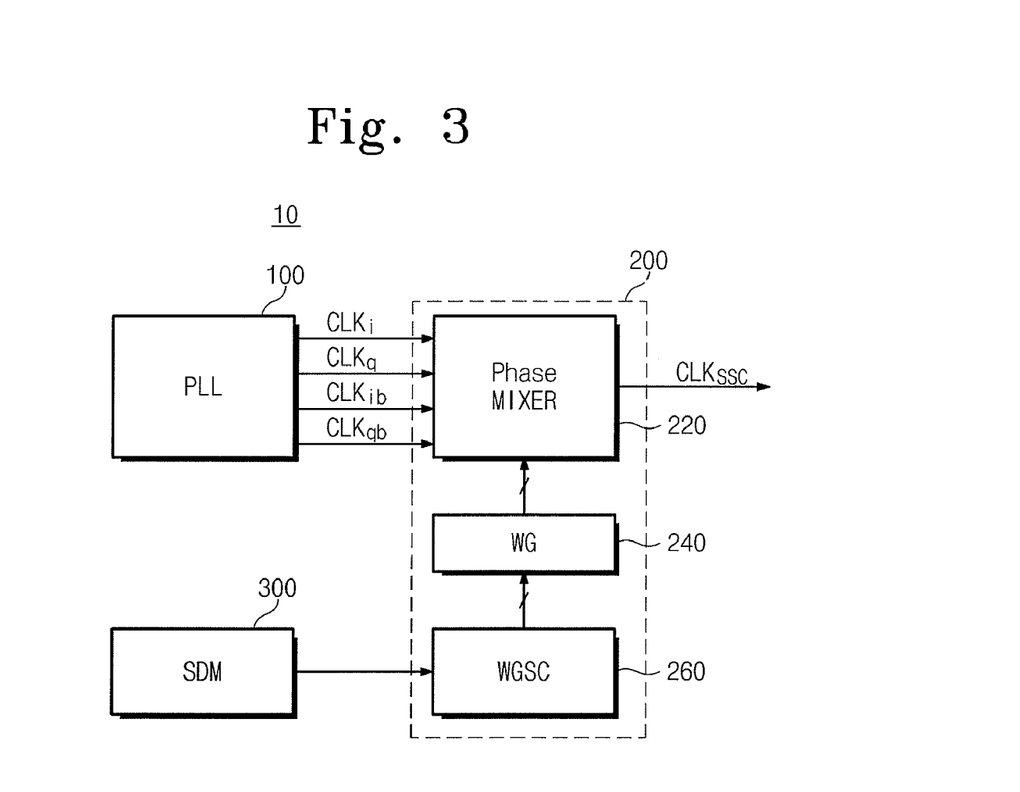
FIG. 3 is a block diagram illustrating a spread-spectrum clock signal generator in accordance with an exemplary embodiment of the present invention.

FIG. 3 is a block diagram illustrating a spread-spectrum clock signal generator 10 in accordance with an exemplary embodiment of the present invention. The spread-spectrum clock signal generator 10 is comprised of a phase-locked loop (PLL) circuit 100, a phase interpolator 200, and a controller 300.

The PLL circuit 100 generates clock signals CLKi, CLKq, CLKib, and CLKqb. In this exemplary embodiment, the clock signals CLKi, CLKq, CLKib, and CLKqb differ from each other in phase by 90°. More specifically, the clock CLKi is 0°, the clock CLKq is 90°, the clock CLKib is 180°, and the clock CLKqb is 270°.

The controller 300 generates a control signal for enabling a clock signal CLKssc to be a spread spectrum clock signal by combining the clock signals CLKi, CLKq, CLKib, and CLKqb. The controller 300 transfers the control signal to the phase interpolator 200. The clock signal CLKssc generated in response to the control signal varies by slow degrees over time. In this exemplary embodiment, the controller may be a sigma delta modulator (SDM).

The controller 300 operates as follows. It is assumed that in the spread-spectrum clock signal generator 10, a frequency of a reference clock signal is 3 GHz. The controller 300 outputs a control signal to gradually lower and modulate the frequency of the clock CLKssc until it arrives at 2.97 GHz, which is 10% less than the reference clock signal. Then, when the clock signal CLKssc arrives at 2.97 GHz, the controller 300 generates the control signal to gradually raise and modulate the frequency of the clock CLKssc.

The controller 300 generates the control signal to periodically repeat the operation described above. A frequency of the control signal is usually less than 30 KHz. This is because a bandwidth of the clock data recovery (CDR) operating with the clock CLKssc is over 30 KHz. If the control signal is a code value, the controller provides the phase interpolator 200 with the code value in the period provided by 30 KHz.

The phase interpolator 200 generates the spread spectrum clock CLKssc by mixing the clock signals CLKi, CLKq, CLKib, and CLKqb, which are transferred from the PLL circuit 100, in response to the control signal provided from the controller 300.

The phase interpolator 200 according to an exemplary embodiment of the present invention is able to adjust an operation speed of generating the spread spectrum clock signal CLKssc. In other words, it is possible to adjust a phase mixture speed of the clock signal CLKssc. The present invention may be exemplarily embodied using the feature that does not directly use the control signal for the phase mixture. The phase interpolator 200 manages the control signal for regulating the phase mixture speed, which will be detailed hereinafter.

Referring to FIG. 3, the phase interpolator 200 is comprised of a phase mixer 220, a weight generator 240, and a weight generation speed controller 260. The phase interpolator 200 mixes phases of the clock signals CLKi, CLKq, CLKib, and CLKqb by means of their current weight.

The weight generation speed controller 260 generates adjusting signals fed to the weight generator 240 in response to a control signal from the controller 300. In this exemplary embodiment, this control signal is generally a discrete digital signal, while the adjusting signals are analog signals. The adjusting signals vary in slow degrees, responding to the control signal. The weight generator 240 outputs a current weight in response to the analog adjusting signals.

In other words, the weight generation speed controller 260 transfers the digital signal from the controller 300 to the weight generator 240 in a plurality of clock signals, not in a single clock signal. This transfer pattern affects a current weight generation speed of the weight generator 240. Thus, the adjusting signals of the weight generator 240 function to determine the current weight generation speed of the weight generator 240. The analog adjusting signals function to control the current weight generation speed and the phase mixture speed.

The weight generator 240 operates to generate the current weight. The weight generator 240 outputs the current weight in response to the analog adjusting signals transferred from the weight generation speed controller 260.

The phase mixer 220 generates the spread spectrum clock signal CLKssc by multiplying the clock signals CLKi, CLKq, CLKib, and CLKqb each by the current weight and then adding the multiplied results.

The spread-spectrum clock generator 10 according to an exemplary embodiment of the present invention does not operate to abruptly change a phase, but varies the phase gradually by using a plurality of clock signals in accordance with the analog adjusting signals of the weight generation speed controller 260. Thus, by controlling speeds of generating the adjusting signals from the weight generation speed controller 260 it is possible to adjust the phase mixture speed of the phase mixer 220. The current weight generation speed of the weight generator 240 is used for adjusting the phase mixture speed of the phase mixer 220. Hence, the phase interpolator 200 is able to adjust, the phase mixture speed. Thereby, the phase interpolator 200 provides an effect of reducing the high-frequency jitter by slowing down the phase mixture.

Therefore, the spread-spectrum clock generator 10 functions to lessen the high-frequency jitter by properly adjusting the phase mixture speed. The suitability for the phase mixture speed is associated with a bandwidth of CDR at the reception stage. The spread-spectrum clock generator 10 operates to inhibit the high-frequency jitter over the bandwidth of CDR at the reception stage. Low-frequency jitter in the bandwidth of CDR does not cause trouble because it can be filtered by the CDR operation at the reception stage. As a result, the spread-spectrum clock signal generator 10 of the exemplary embodiment solves the problem of jitter.

Figure 4:
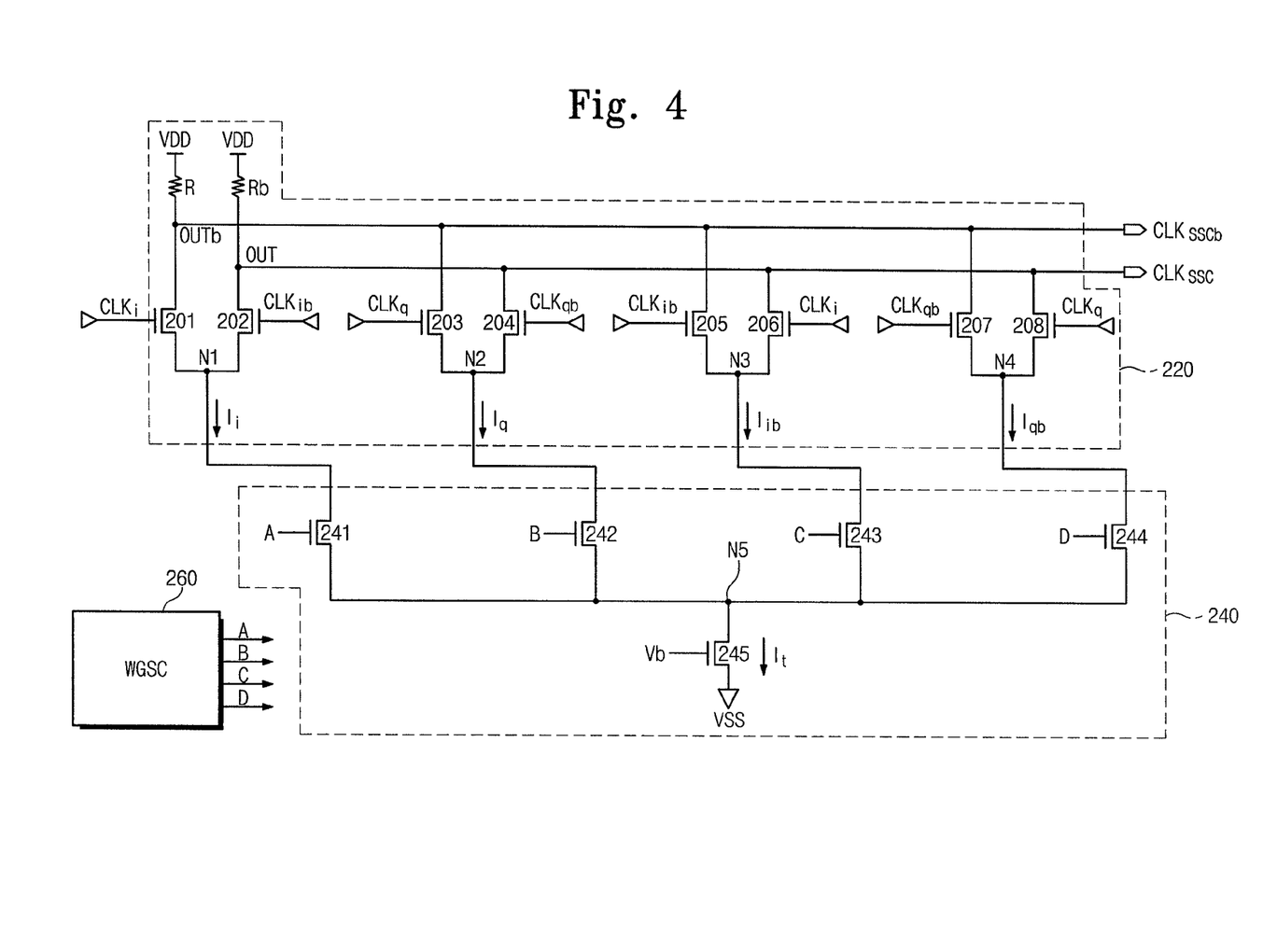
FIG. 4 is a circuit diagram illustrating a phase interpolator in accordance with an exemplary embodiment of the present, invention.

FIG. 4 is a circuit diagram illustrating the phase interpolator 200 of FIG. 3 in accordance with an exemplary embodiment of the present invention. Referring to FIG. 4, the phase interpolator 200 is comprised of the phase mixer 220, the current weight generator 240, and a weight generation adjuster 260.

Referring to FIG. 4, the weight generation speed controller 260 generates the adjusting signals A, B, C, and D in response to the control signal provided from the controller 300 shown in FIG. 3. The current weight generator 240 generates the current weights Ii, Iq, Iib, and Iqb in response to the adjusting signals A, B, C, and D, respectively. The phase mixer 220 generates the spread-spectrum clock CLKssc by multiplying the current weights Ii and Iib each by the clock signals CLKi and CLKib, and current weights Iq and Iqb by clock signals CLKq and CLKqb.

Referring to FIG. 4, the phase mixer 220 is structured in the form of four differential input units responding to selected pairs of the four clock signals CLKi, CLKq, CLKib, and CLKqb.

The first differential input unit is formed of resistors R and Rb, and NMOS transistors 201 and 202. The resistor R is connected between the driving voltage VDD and an output terminal OUTb. The NMOS transistor 201 has a drain coupled to the output terminal OUTb and a source connected to a node N1. The resistor Rb is connected between the driving voltage VDD and the output terminal OUT. The NMOS transistor 202 has a drain coupled to the output terminal OUT and a source connected to the node N1. The NMOS transistor 201 responds to the clock signal CLKi through its gate, while the NMOS transistor 202 responds to the clock signal CLKib through its gate.

The second differential input unit is formed of resistors R and Rb, and NMOS transistors 203 and 204. The resistor R is connected between the driving voltage VDD and the output terminal OUTb. The NMOS transistor 203 has a drain coupled to the output terminal OUTb and a source connected to a node N2. The resistor Rb is connected between the driving voltage VDD and the output terminal OUT. The NMOS transistor 204 has a drain coupled to the output terminal OUT and a source connected to the node N2. The NMOS transistor 203 responds to the clock signal CLKq through its gate, while the NMOS transistor 204 responds to the clock signal CLKqb through its gate.

The third differential input unit is formed of resistors R and Rb, and NMOS transistors 205 and 206. The resistor R is connected between the driving voltage VDD and the output terminal OUTb. The NMOS transistor 205 has a drain coupled to the output terminal OUTb and a source connected to a node N3. The resistor Rb is connected between the driving voltage VDD and the output terminal OUT. The NMOS transistor 206 has a drain coupled to the output terminal OUT and a source connected to the node N3. The NMOS transistor 205 responds to the clock signal CLKib through its gate while the NMOS transistor 206 responds to the clock signal CLKi through its gate.

The fourth differential input unit is formed of resistors R and Rb, and NMOS transistors 207 and 208. The resistor R is connected between the driving voltage VDD and the output terminal OUTb. The NMOS transistor 207 has a drain coupled to the output terminal OUTb and a source connected to a node N4. The resistor Rb is connected between the driving voltage VDD and the output terminal OUT. The NMOS transistor 208 has a drain coupled to the output terminal OUT and a source connected to the node N4. The NMOS transistor 207 responds to the clock signal CLKqb through its gate while the NMOS transistor 208 responds to the clock signal CLKq through its gate.

The current weight generator 240 determines amounts of current flowing through the differential input units of the phase mixer 220. These current amounts are based on the current weights Ii, Iq, Iib, and Iqb of the clock; signals CLKi, CLKq, CLKib, and CLKqb.

The current weight generator 240 includes NMOS transistors 241~245. The first NMOS transistor 241 determines the first current (or first current weight) Ii flowing through the first differential input unit. The first NMOS transistor 241 has a drain connected to the node N1 and a source connected to a node N5. A gate of the NMOS transistor 241 is supplied with a voltage A from the weight generator speed controller 260 that determines an amount of the first current Ii.

The second NMOS transistor 242 determines the second current (or second current weight) Iq flowing through the second differential input unit. The second NMOS transistor 242 has a drain connected to the node N2 and a source connected to the node N5. A gate of the NMOS transistor 242 is supplied with a voltage B from the weight generator speed controller 260 that determines an amount of the second current Ii.

The third NMOS transistor 243 determines the third current (or third current weight) Iib flowing through the third differential input unit. The third NMOS transistor 243 has a drain connected to the node N3 and a source connected to the node N5. A gate of the NMOS transistor 243 is supplied with a voltage C from the weight generator speed controller 260 that determines an amount of the second current Iib.

The fourth NMOS transistor 244 determines the fourth current (or fourth current weight) Iqb flowing through the fourth differential input unit. The fourth NMOS transistor 244 has a drain connected to the node N4 and a source connected to the node N5. A gate of the NMOS transistor 244 is supplied with a voltage D from the weight generator speed controller 260 that determines an amount of the fourth current Iqb.

The NMOS transistor 245 determines the total amount of current flowing through the tour differential input units. The NMOS transistor has a drain connected to the node N5 and a source connected to the ground power source VSS. A gate of the NMOS transistor 245 is supplied with a bias voltage Vb that serves to determine the total current amount. According to the bias voltage Vb, the total current $I_1$ is maintained constant. The total current may be given by $$I_1 = I_i + I_q + I_{ib} + I_{qb}$$

Thus, the spread spectrum clock signal CLKssc mixed by the phase mixer 220 results in $$CLK_{SSC} = \frac{CLK_i^* I_i + CLK_q^* I_q + CLK_{ib}^* I_{ib} + CLK_{qb}^* I_{qb}}{I_i + I_q + I_{ib} + I_{qb}}$$

The spread spectrum clock signal CLKssc is determined by the current weights Ii, Iq, Iib, and Iqb respective to the clock signals CLKi, CLKq, CLKib, and CLKqb.

Figure 5:
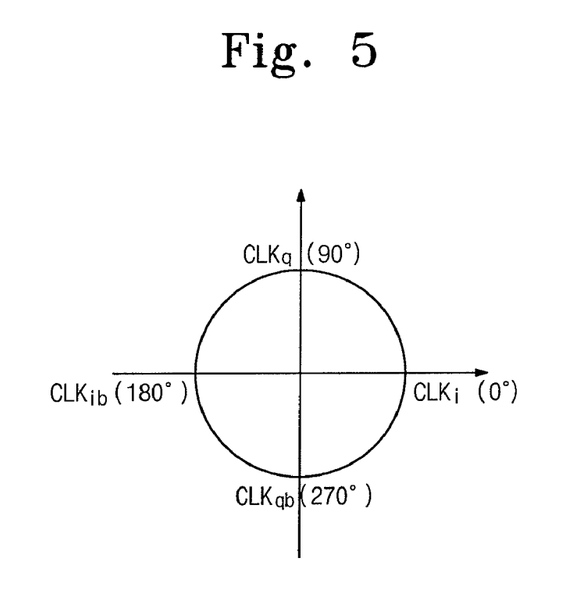
FIG. 5 shows phases of the clock signal applied to the phase interpolator shown in FIG. 4.

Referring to FIG. 5, the phases of the clock signals CLKi, CLKq, CLKib, and CLKqb are as follows. The clock signal CLKi is 0°, the clock signal CLKq is 90°, the clock signal CLKib is 180°, and the clock signal CLKqb is 270°. A phase of the spread spectrum clock signal CLKssc is obtained by multiplying the clock signals CLKi, CLKq, CLKib, and CLKqb by the current weights Ii, Iq, Iib, and Iqb.

For instance, the spread spectrum clock signal CLKssc with the phase of 45° is obtained by mixing the clock signal CLKi of 0° with the clock signal CLKq of 90°. The current weight generator 240 causes the first and second currents Ii and Iq to flow at the same rate.

The weight generation speed controller 260 operates to adjust the speed of generating the currents (or current weights) Ii, Iq, Iib, and Iqb. Referring to FIG. 4, the weight generation speed controller 260 transfers the adjusting signals A, B, C, and D to the weight generator 240. The current weights Ii, Iq, Iib, and Iqb are generated in response to the adjusting signals A, B, C, and D. The weight generation speed controller 260 operates to control a generation speed of the adjusting signals A, B, C, and D for regulating the speed of generating the current weights Ii, Iq, Iib, and Iqb.

The current generation speed is involved in the rate of varying the phase of the spread spectrum clock signal CLKssc. Namely, the speed of generating the current weights Ii, Iq, Iib, and Iqb is adjusted to regulate the speed of generating the spread spectrum clock CLKssc.

The weight generation speed controller 260 operates to slow down the generation of the current weights Ii, Iq, Iib, and Iqb. The weight generation speed controller 260 does not operate to promptly generate the current weights in response to the discrete digital signal from the controller 300. The adjusting signals A, B, C, and D for generating the current weights Ii, Iq, Iib, and Iqb are analog signals that are generated in slow degrees, in response to the control signal of the controller 300, not rapidly as would be the case if the adjusting signals were digital signals.

The weight generation speed controller 260 generates the adjusting signals A, B, C, and D in an analog mode. Responding to the generated analog adjusting signals A, B, C, and D, the weight generator 240 generates the current weights Ii, Iq, Iib, and Iqb in slow degrees. According to the generated analog current weights Ii, Iq, Iib, and Iqb, the phase mixer 220 synthesizes the spread spectrum clock signal CLKssc.

Figure 6:
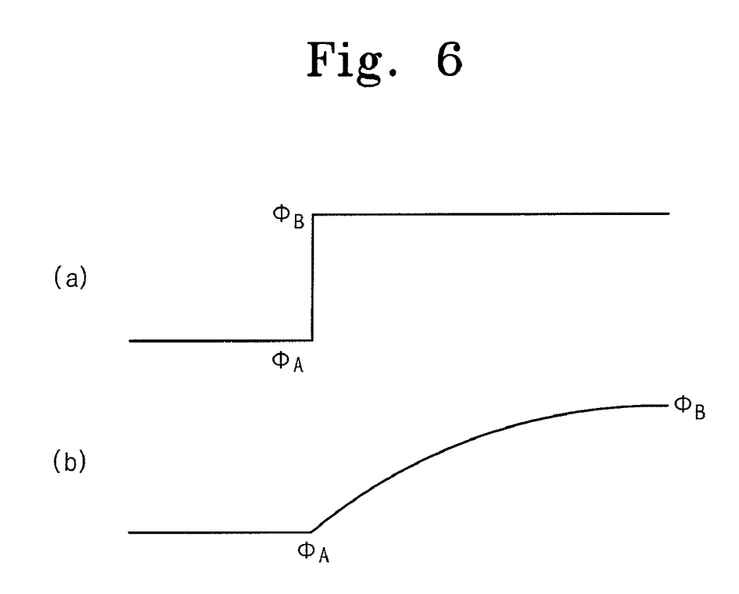
FIG. 6(a) shows a phase variation by a general spread spectrum clock signal.
FIG. 6(b) shows a phase variation by the spread spectrum clock signal according to an exemplary embodiment of the present invention.

FIG. 6(*a*) shows a phase variation of a general spread spectrum clock signal, and FIG. 6(*b*) shows a phase variation of the spread spectrum clock signal according to an exemplary embodiment of the present invention. As illustrated in FIG. 6(*a*), the general spread-spectrum clock signal generator operates to result in an abrupt phase variation from $0_A$ to $0_B$, which causes the high-frequency jitter. Otherwise, referring to FIG. 6(*b*), the spread-spectrum clock signals generator 10 operates to change a phase from $0_A$ to $0_B$ in slow degrees in an analog fashion through plural clock signal cycles, which makes it free from the high-frequency jitter.

Figure 7:
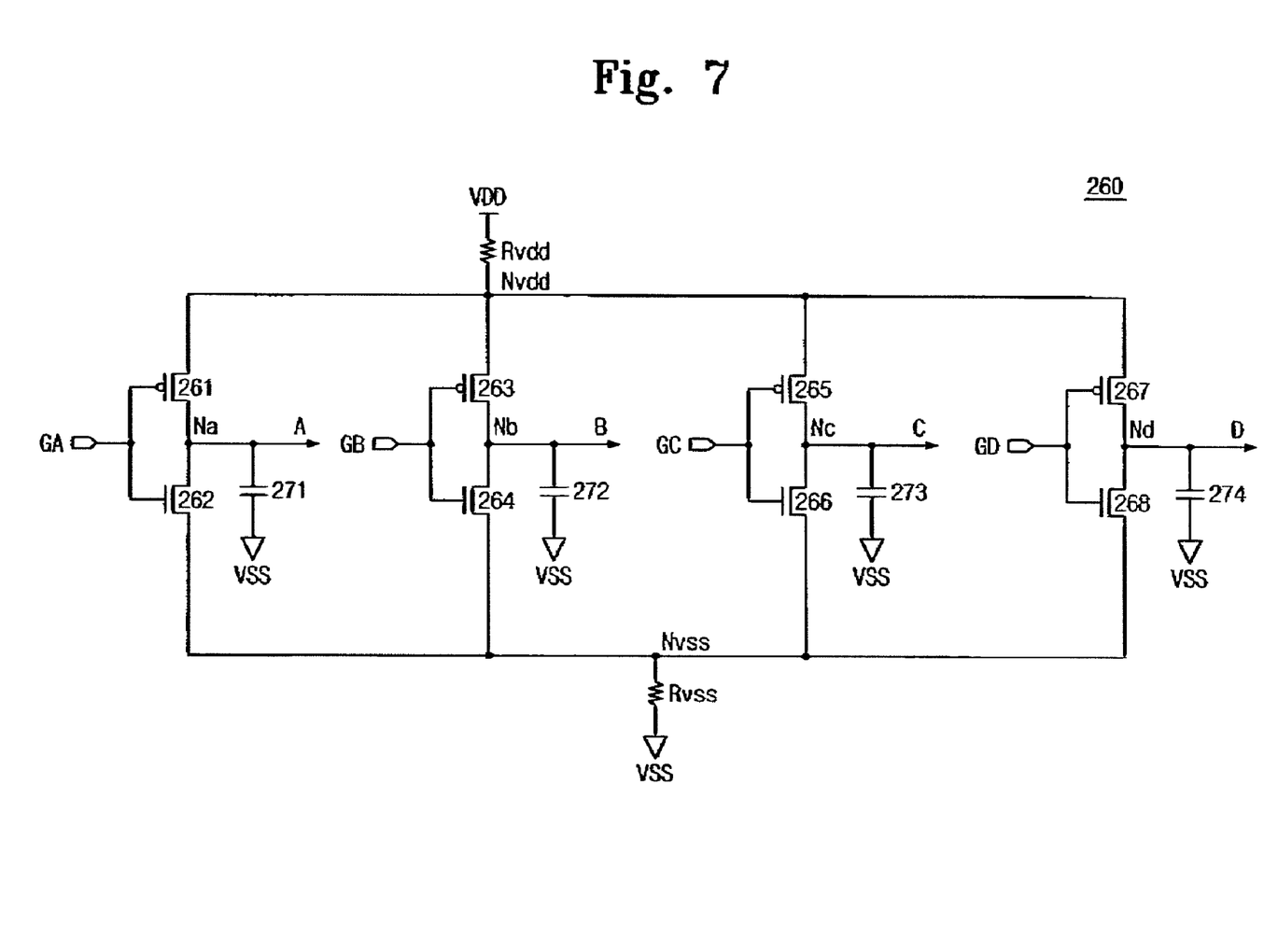
FIG. 7 is a circuit diagram illustrating a weight generation speed controller in accordance with an exemplary embodiment of the present invention.

FIG. 7 is a circuit diagram illustrating the weigh generation speed controller 260 of FIG. 4. The weight generation speed controller 260 uses an RC filtering loop for adjusting the generation speed of the current weights Ii, Iq, Iib, and Iqb. Referring to FIG. 7, the weight generation speed controller 260 includes resistors Rvdd and Rvss, PMOS transistors 261, 263, 265, and 267, NMOS transistors 262, 264, 266, and 268, and capacitors 271, 272, 273, and 274.

The resistor Rvdd is connected between the driving voltage VDD and a node Nvdd. The resistor Rvss is connected between a node Nvss and the ground voltage VSS.

The PMOS transistor 261 has a source connected to the node Nvdd and a drain connected to a node Na. The NMOS transistor 262 has a drain connected to the node Na and a source connected to a node Nvss. The capacitor 271 is coupled between the node Na and the ground voltage VSS. A control signal GA is applied to gates of the PMOS and NMOS transistors 261 and 262 from the controller 300 shown in FIG. 3. Then, the adjusting signal A is output and transferred to the current weight generator 240 of FIG. 4.

The PMOS transistor 263 has a source connected to the node Nvdd and a drain connected to a node Nb. The NMOS transistor 264 has a drain connected to the node Nb and a source connected to the node Nvss. The capacitor 272 is coupled between the node Nb and the ground voltage VSS. A control signal GB is applied to gates of the PMOS and NMOS transistors 263 and 264 from the controller 300. Then, the adjusting signal B is output and transferred to the current weight generator 240.

The PMOS transistor 265 has a source connected to the node Nvdd and a drain connected to a node Nc. The NMOS transistor 266 has a drain connected to the node Nc and a source connected to the node Nvss. The capacitor 273 is coupled between the node Nc and the ground voltage VSS. A control signal GC is applied to gates of the PMOS and NMOS transistors 265 and 266 from the controller 300. Then, the adjusting signal C is output and transferred to the current weight generator 240.

The PMOS transistor 267 has a source connected to the node Nvdd and a drain connected to a node Nd. The NMOS transistor 268 has a drain connected to the node Nd and a source connected to the node Nvss. The capacitor 274 is coupled between the node Nd and the ground voltage VSS. A control signal GD is applied to gates of the PMOS and NMOS transistors 267 and 268 from the controller 300. Then, the adjusting signal D is output and transferred to the current weight generator 240.

An operation of the weight generation speed controller 260 is as follows. The weight generation speed generator 260 receives the control signals GA, GB, GC, and GD from the controller 300 shown in FIG. 3. The control signals GA, GB, GC, and GD each contain information about, the current weights Ii, Iq, Iib, and Iqb. The weight generation speed controller 260 generates the adjusting signals A, B, C, and D from the received control signals GA, GB, GC, and GD, respectively.

Referring to FIG. 7, the adjusting signals A~D are voltages charged in the capacitors 271~274, respectively. The charged voltages of the capacitors 271~274 gradually increase. Accordingly, the adjusting signals A~D are filtered through RC loops and then transferred to the current weight generator 240. In summary, the weight generation speed controller 260 operates to adjust the generation speed (or generation rate) of the current weights Ii, Iq, Iib, and Iqb in an analog fashion.

Figure 8:
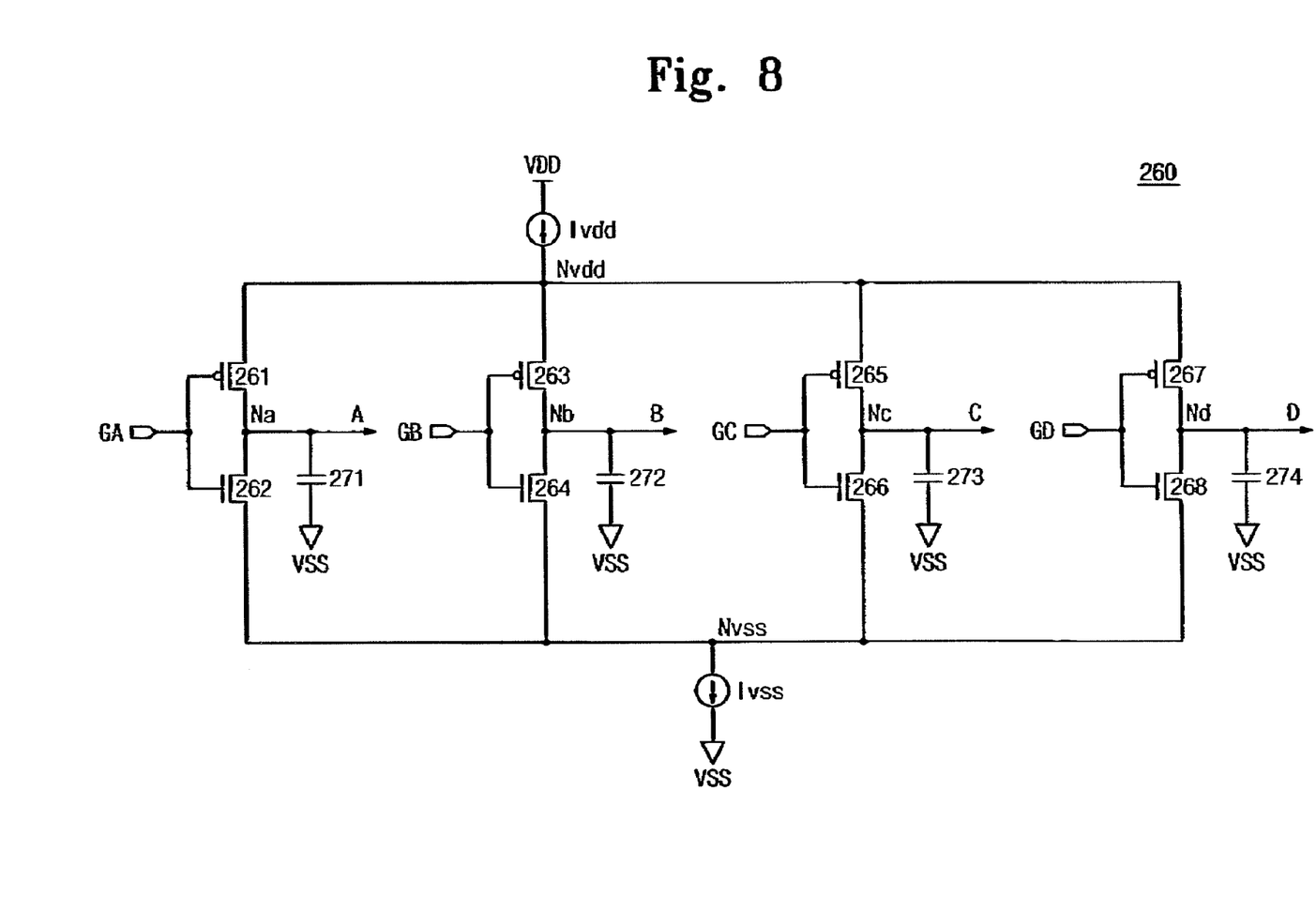
FIG. 8 is a circuit diagram illustrating a weight generation speed controller in accordance with an exemplary embodiment of the present invention.

FIG. 8 illustrates an exemplary embodiment of the weight generation speed controller 260 in accordance with the present invention, employing current sources Ivdd and Ivss instead of the resistors Rvdd and Rvss used in the weight generation speed controller 260 shown in FIG. 7. The current sources Ivdd and Ivss are simply implemented in a PMOS transistor to the power source side and an NMOS transistor to the ground side. The PMOS and NMOS transistors form the current sources by applying constant bias voltages to their gates.

Referring to FIG. 7, a time for charging the capacitor up to the driving voltage is given by C*VDD/Ivdd. The charging time is regulated by adjusting the amounts of the currents flowing through the current sources. The weight generation speed controller 260 of FIG. 8 is the same as that of the FIG. 7 in operation.

Figure 9:
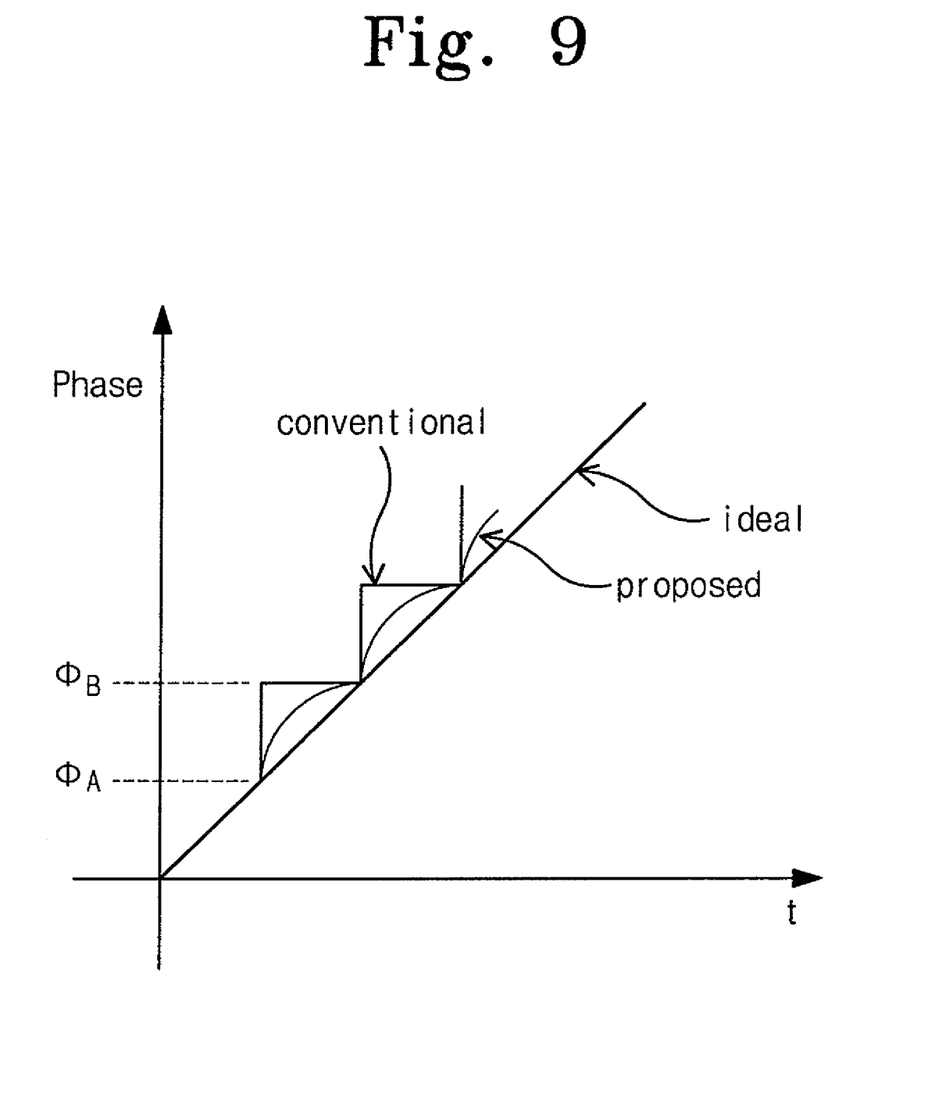
FIG. 9 shows a phase variation by the spread-spectrum clock signal generator according to an exemplary embodiment of the present invention.

FIG. 9 shows a phase variation provided by the spread-spectrum clock signal generator 10 according to an exemplary embodiment of the present invention. An ideal spread-spectrum clock signal generator may vary a phase in a linear form. A practical pattern of phase variation, however, may not be like that ideal linear form. A conventional spread-spectrum clock signal generator varies a phase in a stepwise abrupt pattern. Such an abrupt phase variation causes the high-frequency jitter as aforementioned. On the other hand, the spread-spectrum clock signal generator 10 according to an exemplary embodiment of the present invention operates not to abruptly change a phase of the clock signal from regulating the generation speed of the current weights by means of the weight generation speed adjuster 260. The spread-spectrum clock generator 10 of an exemplary embodiment of the present invention makes a phase change slower and smoother than the conventional system. Thus, the spread-spectrum clock signal generator 10 is able to be free from the trouble of high-frequency jitter.

Figure 10:
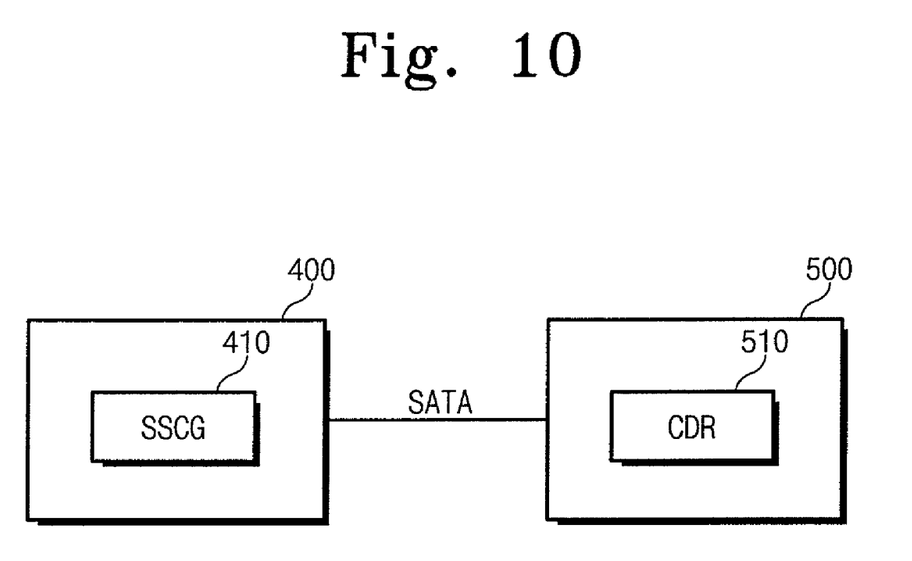
FIG. 10 is a block diagram illustrating a system employing the spread-spectrum clock signal generator in accordance with an exemplary embodiment of the present invention.

FIG. 10 is a block diagram illustrating a system employing the spread-spectrum clock generator in accordance with an exemplary embodiment of the present invention. Referring to FIG. 10, the spread-spectrum clock generator is applicable to a serial AT attachment (SATA) system. A transmittal stage 400 transmits data in sync with a clock signal of the spread-spectrum clock; generator 410. Data is transferred to a reception stage 500 by way of a serial channel of the SATA system. A CDR unit 510 of the reception stage 500 operates to recover the transferred data by means of a bandwidth higher than a modulation frequency of the spread-spectrum clock generator 410.

The spread-spectrum clock generator 410 modulates the clock signal under the frequency of 30 KHz. In this exemplary embodiment, the CDR unit 510 uses a PLL circuit operable in the bandwidth of fBUAD/500. Therefore, the spread-spectrum clock generator 410 of the transmittal stage 400 logically conducts the spread spectrum function. In other words, the CDR unit 510 is able to recover a spread spectrum clock signal output from the spread-spectrum clock generator 410. As a result, the system employing the spread-spectrum clock generator 410 is able to prevent EMI while transferring data.

As the spread-spectrum clock generator 410 operates to gradually generate the spread spectrum clock signal and not abruptly, there is no high-frequency jitter therefrom. Thus, it makes the system free from high-frequency jitter, even while recovering data and clock signals by the CDR unit 510 of the reception stage 500.

As described above, the spread-spectrum clock generator according to exemplary embodiments of the present invention is helpful in preventing high-frequency jitter, because it is equipped with the functional means to adjust a phase variation speed for a digital system in an analog fashion.

The above-described subject matter is to be considered illustrative, and not restrictive, and the appended claims are intended to cover all such modifications, enhancements, and other exemplary embodiments, which fail within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A spread-spectrum clock generator comprising:
a weight generator configured to generate a plurality of weight currents in response to receipt of respective adjusting signals;
a weight generation speed controller configured to generate the adjusting signals and adjust a rate at which each of the adjusting signals is generated in response to a corresponding one of a plurality of control signals,
wherein the weight generation speed controller comprises:
a plurality of pairs of complimentary series transistors connected in parallel with one another between a first resistor connected to a driving voltage and a second resistor connected to a ground voltage, the gates of each pair receives a corresponding one of the control signals; and
a plurality of capacitors, wherein a first terminal of each capacitor is connected to a node between the transistors of a corresponding one of the pairs and a second terminal of each capacitor is connected to the ground voltage, wherein each first terminal outputs a corresponding one of the adjusting signals;
a phase mixer mixing a plurality of clock signals with the weight currents, wherein the weight currents differ from each other in phase, and modulating a clock signal resulting from the mixing; and
a controller generating the plurality of control signals,
wherein a voltage of the adjusting signals increases gradually in an analog manner and the clock signals are generated in an analog manner.

2. The spread-spectrum clock generator as set forth in claim 1, wherein the controller comprises a sigma delta modulator.

3. The spread-spectrum clock generator as set forth in claim 1 further comprising a phase-locked loop generating the plurality of clock signals.

4. A spread-spectrum clock generator comprising:
  a weight generator configured to generate a plurality of weight currents in response to receipt of respective adjusting signals;
  a weight generation speed controller configured to generate the adjusting signals and adjust a rate at which each of the adjusting signals are generated in response to a plurality of control signals;
  a phase mixer receiving a plurality of clock signals, multiplying each of the clocks signals by a respective one of the weight currents, and adding the multiplied results to generate a modulated signal; and
  a controller configured to generate the control signals,
  wherein the phase mixer comprises a plurality of differential units that each receive two of the clock signals,
  wherein the adjusting signals are analog signals that gradually transition from one level to another in response to the control signals,
  wherein the weight generation speed controller comprises:
    a plurality of pairs of complimentary series transistors connected in parallel with one another between a first resistor connected to a driving voltage and a second resistor connected to a ground voltage, the gates of each pair connected to a corresponding one of the control signals; and
    a plurality of capacitors, wherein a first terminal of each capacitor is connected to a node between the transistors of a corresponding one of the pairs and a second terminal of each capacitor is connected to the ground voltage.

5. The spread-spectrum clock generator as set forth in claim 4, wherein a phase difference between the two clock signals is 180 degrees.

6. The spread-spectrum clock generation as set forth in claim 4, wherein the controller is configured to generate the control signals to periodically decrease a current frequency of the modulated signal to a frequency lower than a reference frequency and then increase the current frequency.

7. The spread-spectrum clock generation as set forth in claim 4, wherein each differential unit comprises a pair of transistors connected between a driving voltage and a node receiving a corresponding one of the weight currents, a gate of one of the transistors receives a first one of the two clock signals and a gate of the other transistor receives a second one of the two clocks signals.

8. The spread-spectrum clock generator as set forth in claim 4 further comprising a phase-locked loop generating the plurality of clock signals.

9. The spread-spectrum clock generator of claim 1, wherein the weight generator comprises a plurality of first transistors and a second transistor, wherein a gate of each first transistor receives a corresponding one of the adjusting signals to generate a corresponding one of the weight currents for output to a corresponding one of the nodes, and a drain of the second transistor is connected to sources of each of the first transistors.

10. The spread-spectrum clock generator of claim 9, wherein a bias voltage is applied to a gate of the second transistor to maintain that a total current of the weight currents is constant.

11. The spread-spectrum clock generator of claim 10, wherein a source of the second transistor receives a ground voltage.

* * * * *